(12) United States Patent
Parker et al.

(10) Patent No.: US 9,888,568 B2
(45) Date of Patent: Feb. 6, 2018

(54) MULTILAYER ELECTRONICS ASSEMBLY AND METHOD FOR EMBEDDING ELECTRICAL CIRCUIT COMPONENTS WITHIN A THREE DIMENSIONAL MODULE

(71) Applicant: Crane Electronics, Inc., Redmond, WA (US)

(72) Inventors: Ernest Clyde Parker, Mill Creek, WA (US); Philip Joseph Lauriello, Holmdel, NJ (US)

(73) Assignee: CRANE ELECTRONICS, INC., Redmond, WA (US)

( * ) Notice: Subject to any disclaimer, the term of this patent is extended or adjusted under 35 U.S.C. 154(b) by 360 days.

(21) Appl. No.: 13/758,843

(22) Filed: Feb. 4, 2013

(65) Prior Publication Data
US 2013/0201631 A1 Aug. 8, 2013

Related U.S. Application Data

(60) Provisional application No. 61/596,652, filed on Feb. 8, 2012.

(51) Int. Cl.
*H05K 1/18* (2006.01)
*H05K 1/02* (2006.01)
(Continued)

(52) U.S. Cl.
CPC .......... *H05K 1/0298* (2013.01); *H05K 1/186* (2013.01); *H05K 13/0465* (2013.01);
(Continued)

(58) Field of Classification Search
CPC ... H05K 1/186; H05K 13/0465; H05K 1/0298
See application file for complete search history.

(56) References Cited

U.S. PATENT DOCUMENTS 3,144,627 A 8/1964 Dunnabeck et al.
3,201,728 A 8/1965 McWhirter
(Continued)

FOREIGN PATENT DOCUMENTS

CN 1237854 C 1/2006
CN 101087492 A 12/2007
(Continued)

OTHER PUBLICATIONS

Avishesh Dhalkal et al., Transient Liquid Phase (TLP) Bonding and Sintered Silver Paste for Die-attach/Substrate-attach in High-power, High-temperature Applications, Oct. 21, 2011, Idaho Microelectronics Laboratory, pp. 1-27.*
(Continued)

*Primary Examiner* — Hoa C Nguyen
*Assistant Examiner* — Keith Depew
(74) *Attorney, Agent, or Firm* — Seed IP Law Group LLP

(57) ABSTRACT

A multilayer electronics assembly and associated method of manufacture are provided. The multilayer electronics assembly includes a plurality of stacked substrate layers. Each of the substrate layers is fusion bonded to at least an adjacent one of the plurality of substrate layers. A first discrete electrical circuit component is bonded to a first layer of the plurality of layers. A bonding material is interposed between the discrete electrical circuit component and the first layer. The bonding material has a reflow temperature at which the bonding material becomes flowable that is higher than a fusion bonding temperature of the substrate layers.

30 Claims, 7 Drawing Sheets

(51) Int. Cl.
*H05K 13/04* (2006.01)
*H05K 3/46* (2006.01)

(52) U.S. Cl.
CPC .............. *H01L 2224/32225* (2013.01); *H01L 2224/8384* (2013.01); *H01L 2224/83204* (2013.01); *H01L 2224/83211* (2013.01); *H05K 3/4623* (2013.01)

(56) References Cited

U.S. PATENT DOCUMENTS

| | | | |
|---|---|---|---|
| 3,761,843 A | 9/1973 | Cappucci | |
| 3,949,327 A | 4/1976 | Chapell | |
| 3,955,161 A | 5/1976 | MacTurk | |
| 3,999,150 A | 12/1976 | Caragliano et al. | |
| 4,337,569 A | 7/1982 | Pierce | |
| 4,342,143 A | 8/1982 | Jennings | |
| 4,430,758 A | 2/1984 | Snyder | |
| 4,646,039 A | 2/1987 | Saad | |
| 4,777,458 A | 10/1988 | Pardini | |
| 4,800,345 A | 1/1989 | Podell et al. | |
| 4,837,535 A | 6/1989 | Konishi et al. | |
| 4,956,626 A | 9/1990 | Hoppe et al. | |
| 4,980,662 A | 12/1990 | Simon et al. | |
| 5,032,803 A | 7/1991 | Koch | |
| 5,046,238 A * | 9/1991 | Daigle et al. | 29/830 |
| 5,053,921 A | 10/1991 | Nelson et al. | |
| 5,065,122 A | 11/1991 | Juskey et al. | |
| 5,073,814 A | 12/1991 | Cole, Jr. et al. | |
| 5,081,432 A | 1/1992 | Devlin et al. | |
| 5,087,585 A | 2/1992 | Hayashi | |
| 5,099,309 A | 3/1992 | Kryzaniwsky | |
| 5,235,496 A | 8/1993 | Chomette et al. | |
| 5,274,912 A | 1/1994 | Olenick et al. | |
| 5,280,192 A | 1/1994 | Kryaniwsky | |
| 5,287,619 A | 2/1994 | Smith et al. | |
| 5,293,619 A | 3/1994 | Dean | |
| 5,309,629 A | 5/1994 | Traskos et al. | |
| 5,329,695 A * | 7/1994 | Traskos et al. | 29/830 |
| 5,369,379 A | 11/1994 | Fujiki | |
| 5,382,931 A | 1/1995 | Piloto et al. | |
| 5,406,234 A | 4/1995 | Willems | |
| 5,428,840 A | 6/1995 | Sadhir | |
| 5,432,677 A * | 7/1995 | Mowatt et al. | 361/719 |
| 5,440,805 A | 8/1995 | Daigle et al. | |
| 5,446,842 A | 8/1995 | Schaeffer et al. | |
| 5,467,064 A | 11/1995 | Gu | |
| 5,469,124 A | 11/1995 | O'Donnell et al. | |
| 5,495,394 A | 2/1996 | Kornfeld et al. | |
| 5,499,005 A | 3/1996 | Gu et al. | |
| 5,526,517 A | 6/1996 | Jones et al. | |
| 5,534,830 A | 7/1996 | Ralph | |
| 5,557,245 A | 9/1996 | Taketa et al. | |
| 5,576,669 A | 11/1996 | Ruelke | |
| 5,579,207 A * | 11/1996 | Hayden et al. | 361/790 |
| 5,598,327 A | 1/1997 | Somerville et al. | |
| 5,604,490 A | 2/1997 | Blakley, III et al. | |
| 5,612,660 A | 3/1997 | Takimoto | |
| 5,628,053 A | 5/1997 | Araki et al. | |
| 5,633,615 A | 5/1997 | Quan | |
| 5,649,105 A | 7/1997 | Aldred et al. | |
| 5,657,537 A | 8/1997 | Saia et al. | |
| 5,672,414 A | 9/1997 | Okamoto et al. | |
| 5,689,217 A | 11/1997 | Gu et al. | |
| 5,689,641 A | 11/1997 | Ludwig et al. | |
| 5,694,544 A | 12/1997 | Tanigawa et al. | |
| 5,704,042 A | 12/1997 | Hester et al. | |
| 5,724,508 A | 3/1998 | Harple, Jr. et al. | |
| 5,739,734 A | 4/1998 | Chen et al. | |
| 5,745,017 A | 4/1998 | Ralph | |
| 5,757,074 A | 5/1998 | Matloubian et al. | |
| 5,761,419 A | 6/1998 | Schwartz et al. | |
| 5,781,727 A | 7/1998 | Carleton et al. | |
| 5,799,320 A | 8/1998 | Klug | |
| 5,815,683 A | 9/1998 | Vogler | |
| 5,818,308 A | 10/1998 | Tanaka et al. | |
| 5,819,038 A | 10/1998 | Carleton et al. | |
| 5,834,992 A | 11/1998 | Kato et al. | |
| 5,835,789 A | 11/1998 | Ueda et al. | |
| 5,841,328 A | 11/1998 | Hayashi | |
| 5,867,072 A | 2/1999 | Logothetis | |
| 5,870,547 A | 2/1999 | Pommier et al. | |
| 5,870,585 A | 2/1999 | Stapleton | |
| 5,870,588 A | 2/1999 | Rompaey et al. | |
| 5,886,597 A | 3/1999 | Riad | |
| 5,887,170 A | 3/1999 | Ansberry et al. | |
| 5,892,509 A | 4/1999 | Jakobs et al. | |
| 5,895,473 A | 4/1999 | Williard et al. | |
| 5,929,729 A | 7/1999 | Swarup | |
| 5,940,082 A | 8/1999 | Brinegar et al. | |
| 5,945,892 A | 8/1999 | Kato et al. | |
| 5,966,057 A | 10/1999 | Kintis et al. | |
| 5,966,310 A | 10/1999 | Maeda et al. | |
| 5,974,335 A | 10/1999 | Talisa et al. | |
| 6,002,306 A | 12/1999 | Arakawa | |
| 6,002,307 A | 12/1999 | Arakawa | |
| 6,002,318 A | 12/1999 | Werner et al. | |
| 6,040,739 A | 3/2000 | Wedeen et al. | |
| 6,099,677 A | 8/2000 | Logothetis et al. | |
| 6,137,383 A | 10/2000 | De Lillo | |
| 6,154,106 A | 11/2000 | De Lillo | |
| 6,157,282 A | 12/2000 | Hopkinson | |
| 6,167,363 A | 12/2000 | Stapleton | |
| 6,169,320 B1 | 1/2001 | Stacey | |
| 6,170,154 B1 | 1/2001 | Swarup | |
| 6,204,736 B1 | 3/2001 | Logothetis | |
| 6,208,220 B1 | 3/2001 | Logothetis | |
| 6,218,015 B1 | 4/2001 | Allen et al. | |
| 6,222,427 B1 | 4/2001 | Kato et al. | |
| 6,236,290 B1 | 5/2001 | Abe et al. | |
| 6,295,513 B1 | 9/2001 | Thackston | |
| 6,316,733 B1 | 11/2001 | Centanni et al. | |
| 6,320,509 B1 | 11/2001 | Brady et al. | |
| 6,395,374 B1 * | 5/2002 | McAndrew et al. | 428/138 |
| 6,492,890 B1 | 12/2002 | Woznlczka | |
| 6,501,031 B1 | 12/2002 | Glovatsky et al. | |
| 6,633,005 B2 | 10/2003 | Ichisubo et al. | |
| 6,707,348 B2 | 3/2004 | Ammar | |
| 6,765,455 B1 | 7/2004 | De Lillo et al. | |
| 6,774,743 B2 | 8/2004 | De Lillo et al. | |
| 6,815,739 B2 | 11/2004 | Huff et al. | |
| 6,961,990 B2 | 11/2005 | Logothetis | |
| 7,042,307 B2 | 5/2006 | Logothetis | |
| 7,127,808 B2 | 10/2006 | McAndrew et al. | |
| 7,129,808 B2 | 10/2006 | Roebke et al. | |
| 7,164,584 B2 | 1/2007 | Walz | |
| 7,212,406 B2 | 5/2007 | Kaishian et al. | |
| 7,227,754 B2 | 6/2007 | Griesinger et al. | |
| 7,250,827 B2 | 7/2007 | Logothetis | |
| 7,297,875 B2 | 11/2007 | Lauriello | |
| 7,369,024 B2 | 5/2008 | Yargole et al. | |
| 7,448,126 B2 | 11/2008 | Logothetis | |
| 7,893,804 B2 | 2/2011 | Kaveh Ahangar et al. | |
| 8,009,004 B2 | 8/2011 | Ahangar et al. | |
| 8,764,247 B2 | 7/2014 | Pattekar et al. | |
| 8,873,263 B2 | 10/2014 | Feng et al. | |
| 9,230,726 B1 | 1/2016 | Parker et al. | |
| 2002/0062339 A1 | 5/2002 | Carter et al. | |
| 2005/0233122 A1* | 10/2005 | Nishimura et al. | 428/209 |
| 2005/0236178 A1* | 10/2005 | Lauriello | 174/255 |
| 2006/0044735 A1 | 3/2006 | Hayashi et al. | |
| 2007/0183920 A1 | 8/2007 | Lu et al. | |
| 2008/0017409 A1 | 1/2008 | Takeuchi et al. | |
| 2008/0197724 A1 | 8/2008 | Cullen et al. | |
| 2008/0297985 A1* | 12/2008 | Fjelstad | 361/600 |
| 2009/0025967 A1* | 1/2009 | Boureghda et al. | 174/257 |
| 2009/0162557 A1 | 6/2009 | Lu et al. | |
| 2009/0321045 A1 | 12/2009 | Hernon et al. | |
| 2009/0321046 A1 | 12/2009 | Hernon et al. | |
| 2010/0008112 A1 | 1/2010 | Feng et al. | |
| 2010/0224992 A1* | 9/2010 | McConnelee et al. | 257/723 |
| 2011/0216514 A1* | 9/2011 | Chang | H05K 1/18 361/761 |
| 2011/0266666 A1 | 11/2011 | Maeda et al. | |

(56) References Cited

U.S. PATENT DOCUMENTS

| | | | |
|---|---|---|---|
| 2012/0048605 A1* | 3/2012 | Chung | 174/258 |
| 2012/0106109 A1* | 5/2012 | Kim et al. | 361/771 |
| 2012/0114927 A1* | 5/2012 | Khaselev et al. | 428/220 |
| 2012/0133052 A1 | 5/2012 | Kikuchi et al. | |
| 2012/0153493 A1* | 6/2012 | Lee et al. | 257/774 |
| 2012/0268227 A1 | 10/2012 | Howes et al. | |
| 2012/0314390 A1* | 12/2012 | Chang | H05K 1/186 |
| | | | 361/761 |
| 2013/0088841 A1 | 4/2013 | Ohshima et al. | |
| 2013/0299148 A1 | 11/2013 | Hernon et al. | |
| 2014/0118946 A1 | 5/2014 | Tong et al. | |
| 2014/0159250 A1* | 6/2014 | Nickerson | 257/774 |
| 2015/0137412 A1 | 5/2015 | Schalansky | |

FOREIGN PATENT DOCUMENTS

| | | |
|---|---|---|
| CN | 101884254 A | 11/2010 |
| CN | 104145538 A | 11/2014 |
| EP | 0 446 656 A1 | 9/1991 |
| EP | 0 520 434 A1 | 6/1992 |
| EP | 0 767 496 A1 | 4/1997 |
| EP | 0 795 907 A1 | 9/1997 |
| EP | 1 060 647 B1 | 1/2007 |
| EP | 1 869 724 B1 | 5/2011 |
| EP | 2 813 132 A1 | 12/2014 |
| GB | 2 325 996 A | 12/1998 |
| IN | 201407180 P1 | 4/2015 |
| JP | 59-86301 A | 5/1984 |
| JP | 63-220603 A | 9/1988 |
| JP | 05-144973 A | 6/1993 |
| JP | 7-307574 A | 11/1995 |
| JP | 10-270630 A | 10/1998 |
| JP | 2001-024333 A | 1/2001 |
| JP | 2002-270731 A | 9/2002 |
| JP | 2004-58088 A | 2/2004 |
| JP | 2007-251076 A | 9/2007 |
| JP | 2007-324419 A | 12/2007 |
| JP | 2008-244191 A | 10/2008 |
| JP | 2009-141197 A | 6/2009 |
| JP | 2011-228631 A | 11/2011 |
| WO | 98/39105 A1 | 9/1998 |
| WO | 2005/027197 A2 | 3/2005 |
| WO | 2005/079353 A2 | 9/2005 |
| WO | 2006/099419 A1 | 9/2006 |
| WO | 2009/094537 A2 | 7/2009 |
| WO | 2010/110626 A2 | 9/2010 |
| WO | 2011/016555 A1 | 2/2011 |
| WO | 2011/040502 A1 | 4/2011 |
| WO | 2011/125354 A1 | 10/2011 |
| WO | 2012/100810 A1 | 8/2012 |
| WO | 2013/119643 A1 | 8/2013 |
| WO | 2014/103298 A1 | 7/2014 |

OTHER PUBLICATIONS

Manfredi et al., "Additive Manufacturing of Al Alloys and Aluminium Matrix Composites (AMCs)," in Monteiro (ed.), *Light Metal Alloys Applications*, InTech, Jun. 11, 2014, 32 pages.
Parker et al., "Transformer-Based Power Converters With 3D Printed Microchannel Heat Sink," U.S. Appl. No. 14/627,556, filed Feb. 20, 2015, 44 pages.
International Search Report, dated Jun. 2, 2013, for PCT/US2013/024907, 4 pages.
Written Opinion, dated Jun. 2, 2013, for PCT/US2013/024907, 10 pages.
Göbl, C.; Faltenbacher, J., "Low Temperature Sinter Technology Die Attachment for Power Electronic Applications," CIPS Seminar, Nuremberg, Germany, Mar. 16-19, 2010, 5 pgs.
Sang Won Yoon; Shiozaki, K.; Yasuda, S.; Glover, M.D., "Highly reliable nickel-tin transient liquid phase bonding technology for high temperature operational power electronics in electrified vehicles," *Applied Power Electronics Conference and Exposition (APEC), 2012 Twenty-Seventh Annual IEEE*, Feb. 5-9, 2012, pp. 478-482.
European Search Report, dated Dec. 4, 2015, for European Application No. 13746884.9-1803, 8 pages.
Parker, "Transformer-Based Power Converters With 3D Printed Microchannel Heat Sink," Office Action, dated Aug. 3, 2015, for U.S. Appl. No. 14/627,556, 11 pages.
Parker et al., "Transformer-Based Power Converters With 3D Printed Microchannel Heat Sink," Office Action dated Apr. 16, 2015, for U.S. Appl. No. 14/627,556, 9 pages.
Chinese Office Action, dated Jun. 27, 2016, for corresponding Chinese Application No. 201380007571.1, 19 pages.
International Search Report and Written Opinion of the International Searching Authority, dated May 31, 2016, for International Application No. PCT/US2016/018628, 12 pages.
Japanese Office Action, dated Sep. 27, 2016, for Japanese Application No. 2014-556629, 4 pages. (with English Translation).
Japanese Office Action, dated May 16, 2017, for Japanese Application No. 2014-556629, 6 pages. (with English Translation).
Barrett, "Microwave Printed Circuits—The Early Years," *IEEE Transactions on Microwave Theory and Techniques MTT*—32(9):983-990, Sep. 1984.
Bharj, "Evanescent Mode Waveguide to Microstrip Transition," *Microwave Journal—International Edition 26*, vol. 2, p. 147, Feb. 1983.
Chiou et al., "Balun design for uniplanar broad band double balanced mixer," *Electronics Letters* 31(24):2113-2114, Nov. 23, 1995.
Cohn, "Shielded Coupled-Strip Transmission Line," *IRE Transactions on Microwave Theory and Techniques MTT*—3(5):29-38, Oct. 1955.
Craven et al., "The Design of Evanescent Mode Waveguide Bandpass Filters for a Prescribed Insertion Loss Characteristic," *IEEE Transactions on Microwave Theory and Techniques MTT*—19(3):295-308, Mar. 1971.
Cristal et al., "Theory and Tables of Optimum Symmetrical TEM-Mode Coupled-Transmission-Line Directional Couplers," *IEEE Transactions on Microwave Theory and Techniques MTT*—13(5):544-558, Sep. 1965.
De Lillo, "Multilayer Dielectric Evanescent Mode Waveguide Filter," U.S. Appl. No. 09/677,674, filed Oct. 2, 2000, 48 pages.
De Lillo, "Multilayer Dielectric Evanescent Mode Waveguide Filter Utilizing via Holes," U.S. Appl. No. 09/604,502, filed Jun. 27, 2000, 57 pages.
European Search Report, dated May 21, 2003, for EP application No. 00939819.9, 2 pages.
Gokdemir et al., "Design and Performance of GaAs MMIC CPW Baluns Using Overlaid and Spiral Couplers," *1997 IEEE MTT-S Digest*, pp. 401-404, 1997.
Gunston, *Microwave Transmission-Line Impedance Data*, Van Nostrand Reinhold Company, London, 1972, pp. 23-24, 26, 61. (6 total pages).
Gunston, *Microwave Transmission-Line Impedance Data*, Van Nostrand Reinhold Company, London, 1972, pp. 63-81.
Hallford, "A Designer's Guide to Planar Mixer Baluns," *Microwaves*, 52-57, Dec. 1979, 4 pages.
Henderson, "Mixers: Part 2—Theory and Technology," *RF Microwave Designer's Handbook*, pp. 476-483, 1998.
Ho et al., "New analysis technique builds better baluns," *Microwaves & RF*, pp. 99-102, Aug. 1985.
Howe, Jr., "Microwave Integrated Circuits—An Historical Perspective," *IEEE Transactions on Microwave Theory and Techniques MTT*—32(9):991-996, Sep. 1984.
International Search Report, dated Aug. 12, 2002, for PCT/US01/50033, 1 page.
Jansen et al., "Improved compaction of multilayer MMIC/MCM baluns using lumped element compensation," *1997 IEEE MTT-S Digest*, pp. 277-280, 1997.
Konishi, "Novel Dielectric Waveguide Components—Microwave Applications of New Ceramic Materials," *Proceedings of the IEEE* 79(6):726-740, Jun. 1991.

(56) References Cited

OTHER PUBLICATIONS

Kumar et al., "An Improved Planar Balun Design for Wireless Microwave and RF Applications," *1997 IEEE*, pp. 257-260, Apr. 1997.
Lauriello, "Process for Manufacturing Fusion Bonded Attached Leads," U.S. Appl. No. 11/901,749, filed Sep. 19, 2007, 14 pages.
Ledain et al., "Innovative Multilayer Technologies for Active Phased Array Antennas," Dassault Electronique, Saint-Cloud, France, 1997, 7 pages.
Levy, "General Synthesis of Asymmetric Multi-Element Coupled-Transmission-Line Directional Couplers," *IEEE Transactions on Microwave Theory and Techniques MTT*—11(4):226-237, Jul. 1963.
Levy, "Tables for Asymmetric Multi-Element Coupled-Transmission-Line Directional Couplers," *IEEE Transactions on Microwave Theory and Techniques MTT*—12(3):275-279, May 1964.
Light et al., "High Frequency, Fluoropolymer-Based Packaging Technology," IBM Microelectronics, Endicott, NY, Oct. 1994, 16 pages.
Maas, "The Diode-Ring Mixer," RF Design Magazine, pp. 54-62, Nov. 1993, 5 pages.
Marchand, "Transmission-Line Conversion," *Electronics* 17(12):142-145, Dec. 1944.
Oltman, "The Compensated Balun," *IEEE Transactions on Microwave Theory and Techniques MTT*—14(3):112-119, Mar. 1966.
Palamutcuoglu et al., "Broadband Microwave Mixer Mounted on Suspended Line Baluns," *1994 IEEE*, pp. 500-503, 1994.
Rizzi, *Microwave Engineering: Passive Circuits*, Prentice Hall, Englewood Cliffs, New Jersey, pp. 200-219, 1988, 21 pages.
Snyder, "New Application of Evanescent Mode Waveguide to Filter Design," *IEEE Transactions on Microwave Theory and Techniques MTT*—25(12):1013-1021, Dec. 1977.
Sturdivant, "Balun Designs for Wireless, . . . Mixers, Amplifiers and Antennas," *Applied Microwave*, pp. 34-44, Summer 1993, 6 pages.
Toyoda et al., "Three-Dimensional MMIC and Its Application: An Ultra-Wideband Miniature Balun," *IEICE Trans. Electron.* E78-C(8):919-924, Aug. 1995.
Tresselt, "Design and Computed Theoretical Performance of Three Classes of Equal-Ripple Nonuniform Line Couplers," *IEEE Transactions on Microwave Theory and Techniques MTT*—17(4):218-230, Apr. 1969.
Tutt et al., "A Low Loss, 5.5 GHz—20 GHz Monolithic Balun," *1997 IEEE MTT-S Digest*, pp. 933-936, 1997.
Willems et al., "Evanescent-Mode Waveguide Filters Built in a Day," *Microwaves & RF* 26(7):117-124, Jul. 1987, 5 pages.

\* cited by examiner

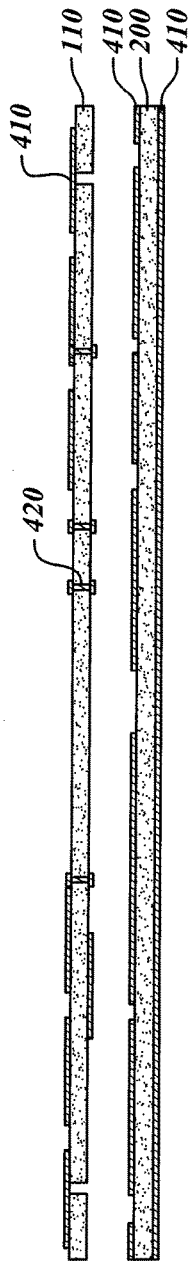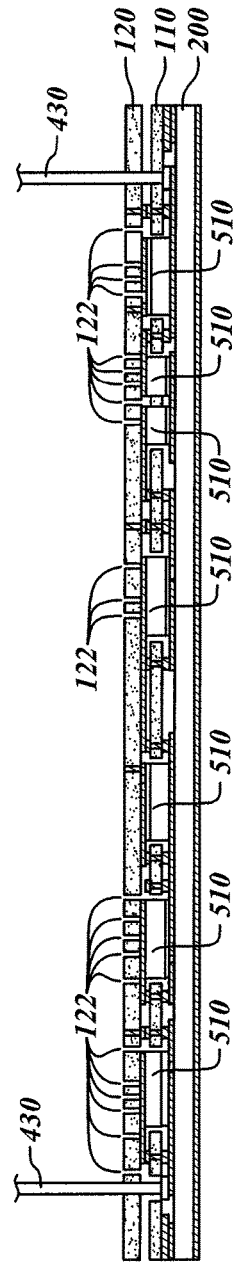

MULTILAYER ELECTRONICS ASSEMBLY AND METHOD FOR EMBEDDING ELECTRICAL CIRCUIT COMPONENTS WITHIN A THREE DIMENSIONAL MODULE

BACKGROUND

Technical Field

The present disclosure relates to a multilayer electronics assembly and an associated method of manufacture.

Description of the Related Art

Conventionally, multilayer printed circuit boards using epoxy fiberglass (FR4), fluoropolymer composites (such as polytetrafluoroethylene, PTFE), or mixed dielectric (MDk, a combination of FR4 and PTFE) have been used to route signals to components that are mounted on the surface of a multilayer structure. These multilayer printed circuit boards most commonly include traces that are etched copper as one means of routing signals to components. For these circuits, resistors can be screen-printed or etched. These multilayer printed circuit board assemblies can be used in a variety of applications including, among others, RF and power electronics modules. As one example, these technologies can form multifunction modules (MFM) which carry monolithic microwave integrated circuits (MMICs) on their surface.

In another conventional method, multilayer integrated circuits and microwave, multifunction modules, are constructed of multiple layers of fluoropolymer composite substrates that are bonded together into a multilayer structure by utilizing a fusion bonding process. The composite substrate material can be PTFE filled with glass fibers and ceramic. These multilayer structures may include thin film resistors that are screen printed or etched into the individual layers prior to the fusion process. For example, resistors can be etched into thin nickel phosphate films adjacent to copper layers, using a method that is similar to copper etching.

Certain discrete electrical circuit components, for example discrete devices, such as passive discrete resistors, capacitors, magnetic devices, and active semiconductor devices, are not merely thin films created by etching or screen printing. Instead, these discrete devices are attached to a substrate with, for example, a solder paste that cannot withstand the heat and/or pressure of the fusion bonding process. To incorporate such discrete electrical circuit components into a multilayer integrated assembly, the conventional method includes forming cavities in individual substrate layers, attaching the discrete electrical circuit components in the cavities, and applying a polymer bonding film layer as a separate, post-fusion bonding step. For example, U.S. Pat. No. 6,009,677 to Logothetis et al. and U.S. Pat. No. 6,395,374 to McAndrews et al. describe a process for manufacturing a multilayer structure of fusion bonded fluoropolymer composite substrates in which discrete electrical circuit components are attached post-bonding within cavities formed in the multilayer structure, and then covered with a film bonded layer.

BRIEF SUMMARY

It has been observed that a multilayer electronics assembly can be achieved by using a bonding material to attach the discrete components that: (1) has a processing temperature for attaching discrete components that is lower than a glass transition temperature of the layers of the multilayer structure to which the discrete components are attached, and (2) goes through a state transition following processing to attach the discrete components that results in requiring a significantly higher temperature post-processing in order to change back to a liquid, flowable, or pliable state, in which the post-processing state transition temperature is also substantially higher than the fusion bonding temperature of the substrate layers of the multilayer electronics assembly.

A multilayer electronics assembly may be summarized as including a plurality of stacked substrate layers, each of the plurality of substrate layers fusion bonded to at least an adjacent one of the plurality of substrate layers; a first discrete electrical circuit component bonded to a first layer of the plurality of layers; and a bonding material interposed between the discrete electrical circuit component and the first layer, the bonding material having a reflow temperature at which the bonding material becomes flowable that is higher than a fusion bonding temperature of the substrate layers.

The multilayer electronics assembly may further include a second discrete electrical circuit component bonded to a second layer of the plurality of layers. The plurality of substrate layers may be stacked in a first direction, and the first discrete electrical component overlaps the second discrete electrical component in the first direction. The plurality of substrate layers may be stacked in a first direction, and the first discrete electrical circuit component may be positioned between adjacent layers of the plurality of stacked substrate layers. The substrate layers may include a fluoropolymer composite. The bonding material may be nanosilver sintered solder. The bonding material may be a transient liquid phase bonded alloy. The first discrete electrical circuit component may be one of a passive discrete resistor, a capacitor, a magnetic device, and an active semiconductor device.

A multilayer electronics module may be summarized as including a three dimensional, unitary block of a first material having a reflow point, at which the bonding material becomes flowable, at a first temperature; and a plurality of discrete electrical circuit components embedded within the unitary block, each of the plurality of discrete electrical circuit components bonded to the block by a second material having a melting point at a second temperature that is higher than the first temperature.

The unitary block may include an exterior surface defined by a top surface, a bottom surface, and a plurality of side surfaces, and the first material may completely surround at least a first one of the plurality of discrete electrical components such that the first material is positioned between all sides of the first one of the plurality of discrete electrical components and any point on the exterior surface of the unitary block. The first material may not directly contact the first one of the plurality of discrete electrical components. The plurality of discrete electrical circuit components may include a first discrete electrical circuit component, a second discrete electrical circuit component, and a third discrete electrical circuit component, the first discrete electrical circuit component overlaps the second discrete electrical circuit component in a first direction, and the first discrete electrical circuit component overlaps the third discrete electrical circuit component in a second direction that is perpendicular to the first direction. The first material may be a fluoropolymer composite. The second material may be nanosilver sintered solder. The first material may be a transient liquid phase bonded alloy. The plurality of discrete electrical circuit components may be selected from a group consisting of a passive discrete resistor, a capacitor, a magnetic device, and an active semiconductor device.

A multifunction module may be summarized as including a primary substrate, a power semiconductor die bonded to the primary substrate; a plurality of secondary substrates stacked on the primary substrate and fusion bonded to each other, a first discrete electrical circuit component bonded to a first substrate of the plurality of secondary substrates with a first material that has a first melting point that is higher than a fusion bonding temperature of the substrate layers, and a second discrete electrical circuit component bonded to a second substrate of the plurality of secondary substrates with a second material that has a second melting point that is higher than the fusion bonding temperature of the substrate layers; and an active electronic component attached to an external surface of one of the plurality of secondary substrates that is positioned furthest from the primary substrate. The first material may be the same as the second material.

A method of embedding discrete electrical circuit components within a multilayer module may be summarized as attaching a first discrete electrical circuit component to a first substrate via a first bonding material that is initially flowable at a first temperature thereby causing the bonding material to go through a state transition such that, once the bonding material hardens, the bonding material will not return to a flowable state until a second temperature, which is higher than the first temperature, is reached, the first temperature is lower than a fusion bonding temperature of the first substrate, and the second temperature is higher than the fusion bonding temperature of the first substrate; attaching a second discrete electrical circuit component to a second substrate via the bonding material; and fusion bonding the first substrate to the second substrate.

Attaching the first discrete electrical circuit component to the first substrate may include nanosilver sintering the first discrete electrical circuit component to the first substrate. Attaching the first discrete electrical circuit component to the first substrate may include transient liquid phase bonding the first discrete electrical circuit component to the first substrate.

A multilayer electronics assembly may be summarized as including a plurality of substrate layers stacked in first direction, each of the plurality of substrate layers bonded to at least an adjacent one of the plurality of substrate layers; a bonding material having an initial transition temperature at which the bonding material becomes initially flowable, and a subsequent transition temperature at which the bonding material subsequently becomes flowable after hardening following the initially becoming flowable, the initial transition temperature lower than the subsequent transition temperature; a first discrete electrical circuit component bonded to a first layer of the plurality of layers with a bonding material, the bonding material; and a second discrete electrical circuit component bonded to a second layer of the plurality of layers with the bonding material, the second discrete electrical component overlaps the first discrete electrical component in the first direction.

In the multilayer electronics assembly, the bonding material is a solid immediately prior to the subsequent transition temperature being reached. The substrate layers may include at least one of epoxy fiberglass and polyamide. The bonding material may be nanosilver sintered solder or a transient liquid phase bonded alloy. The first discrete electrical circuit component may be one of a passive discrete resistor, a capacitor, a magnetic device, and an active semiconductor device.

A method of embedding discrete electrical circuit components within a multilayer module is summarized as including attaching a first discrete electrical circuit component to a first substrate via a bonding material at a first temperature thereby causing the bonding material to go through a state transition such that the bonding material will not return to a flowable state until a second temperature, which is higher than the first temperature, is reached; attaching a second substrate to the first substrate; and attaching a second discrete electrical circuit component to the second substrate via the bonding material at the first temperature.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

FIGS. 3A-3F illustrate several sequential acts for embedding discrete electrical circuit components within a multilayer module.

DETAILED DESCRIPTION

I. System Overview

Figure 1B:
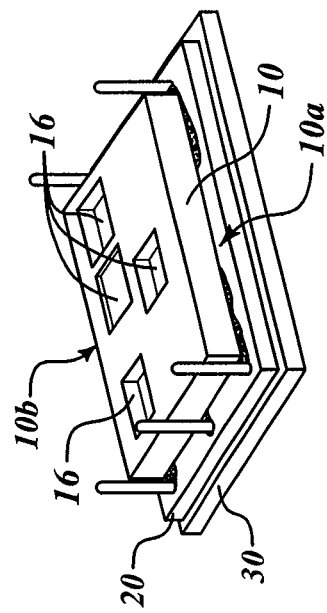
FIG. 1B is a pictorial view of the multilayer electronics assembly of FIG. 1A in a partially assembled state.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electrical circuits, including discrete electrical components such discrete electronic components, and/or printed circuit boards including insulative substrates and conductive traces and vias have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

For the purposes of the present disclosure, the phrase "discrete electrical circuit component" is intended to include discrete electrical circuit components, including electronic components which are formed separately from the printed circuit board and are thus selectively placeable thereon or attachable thereof, and exclude thin film elements that are formed as part of forming the printed circuit board as screen printed or etched directly into the traces of individual layers of a multilayer module (i.e. resistors that are etched into thin nickel phosphate films adjacent to copper layers, using a method that is similar to copper etching).

As discussed above, conventional fusion bonded multilayer modules do not support embedding discrete electrical circuit components within the module due to the inability of conventional device attachment methods to survive the temperature/pressure of fusion bonding. Instead, the conventional fusion bonding method includes forming cavities in individual substrate layers, attaching the discrete electrical circuit components in the cavities, and applying a polymer bonding film layer as a separate, post-fusion bonding step. This technique adds process steps, does not provide as good of protection for the discrete electrical circuit components (particularly bare semiconductor die), and does not support as high of density of packaging in a three dimensional module. For example, only one discrete electrical circuit component can be placed in a given horizontal (X-Y) location in a cavity, and devices cannot be stacked or overlap within the vertical (Z) dimension. Further, discrete electrical circuit components that are placed within cavities and then covered by an additional layer or layers cannot be electrically connected to the additional covering layer(s) unless additional post-fusion drilling or etching and plating is performed. In addition, the immunity to moisture ingress is limited by the integrity of the bonding film that is applied as a post-fusion step, instead of the integrity of the unitary structure formed through fusion bonding.

The techniques of the present disclosure may provide improved packaging density and performance for electronic products, particularly for microwave and power applications, when compared with the conventional method. Specifically, the present disclosure describes a method for embedding discrete electrical circuit components, both active and passive devices, three dimensionally within a fusion bonded multilayer module. The resulting assembly achieves higher density and potentially better performance due to reduced circuit parasitics, particularly for circuits operating with high frequency, high di/dt, or dv/dt, compared to non-integrated (e.g., surface mount, non-three dimensional) solutions.

As discussed in greater detail below, the discrete electrical circuit components are attached using a device attachment method that has a process temperature compatible with discrete electrical circuit components and the composite module fusion bonding temperature and a re-melt temperature significantly above the composite module fusion bonding temperature. For example, a bonding material can be used that has an initial transition temperature at which the bonding material becomes initially flowable, and a subsequent transition temperature at which the bonding material subsequently becomes flowable after hardening following initially becoming flowable. The initial transition temperature is lower than the subsequent transition temperature For example, as discussed in greater detail below, a device attachment technique such as nanosilver sintering or transient liquid phase bonding are used to attach the discrete electrical circuit components to the substrate layers prior to fusion bonding. Each of these device attach methods shares the characteristic that: (1) the process temperature is less than the substrate and discrete electrical circuit component rated temperatures for soldering (or alternative device attachment) and (2) the resulting bonding material has a significantly higher re-melt or reflow temperature than conventional solder and is greater than the composite substrate fusion temperature.

II. Hardware

Figure 1A:
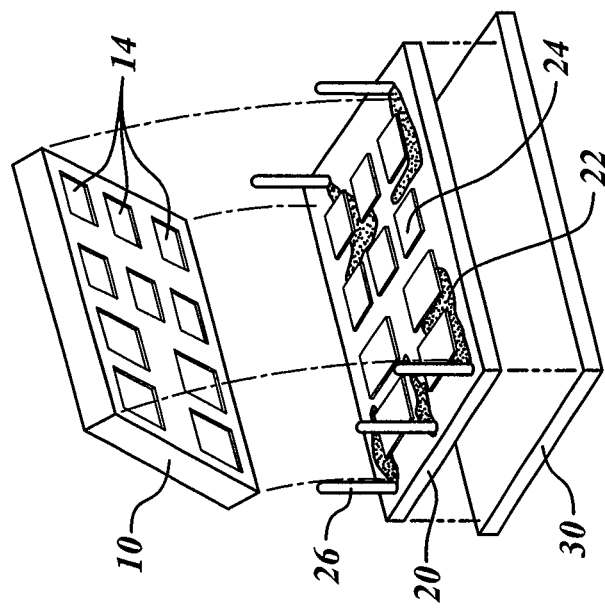
FIG. 1A is an exploded, pictorial view of a multilayer electronics assembly.

FIGS. 1A and 1B are simplified representations of a multilayer electronics assembly incorporated into a device according to one example. FIG. 1A shows exploded view of the major sub-assemblies of the device. The subassemblies include a multilayer electronics assembly 10, base substrate 20, and a heat-sink 30.

In this example, the base substrate 20 can be an aluminum nitride (AlN) direct bonded copper (DBC) substrate that includes a plurality of conductive traces 22 (such as, for example, copper traces) on a top surface thereof, a plurality of bare die 24 (such as, for example, power Metal Oxide Semiconductor Field Effect Transistors, MOSFETs) bonded to the top surface thereof, and a plurality of interconnecting posts 26 extending from the top surface thereof.

The multilayer electronics assembly 10 includes discrete electrical circuit components embedded therein in three dimensions. As discussed in greater detail below, the multilayer electronics assembly 10 is formed by a fusion bonding process in which the discrete electrical circuit components are bonded to the internal layers of the assembly prior to fusion bonding. A plurality of cavities 14 are formed on a bottom surface of the multilayer electronics assembly 10 to accommodate the bare die 24 on the substrate 20. As shown in FIG. 1B, the multilayer electronics assembly 10 also includes a plurality of cavities 16 on a top surface thereof to accommodate higher profile parts that are attached using surface mount technology. Thus, active components can be attached on a top side, at 10b, of the multilayer electronics assembly 10 or on a bottom side, at 10a, of the multilayer electronics assembly 10.

In one example, the bare die 24 on the substrate 20 are attached to the multilayer electronics assembly 10 with a nanosilver sintering technique. For example, a nanosilver sintered solder paste can be used within the cavities 14. In this example, nanosilver sintering is achieved with a temperature profile that ramps to approximately 180° C. to bake out the binder within the nanosilver paste and then raises the temperature to approximately 280° C. for 10 minutes to sinter the nanosilver particles. The resulting interfacial "solder" joint has a significantly lower thermal and electrical resistance than conventional lead or lead-free solder, improved integrity in the presence of repeated thermal cycling induced stress, and, a solder joint that will not 'reflow' until >900° C. This latter property allows post-processing that potentially includes exposure to the fusion bonding process of the multilayer electronics assembly 10 and post-process soldering of top-side components without reflow of the power semiconductor solder joints.

Figure 2:
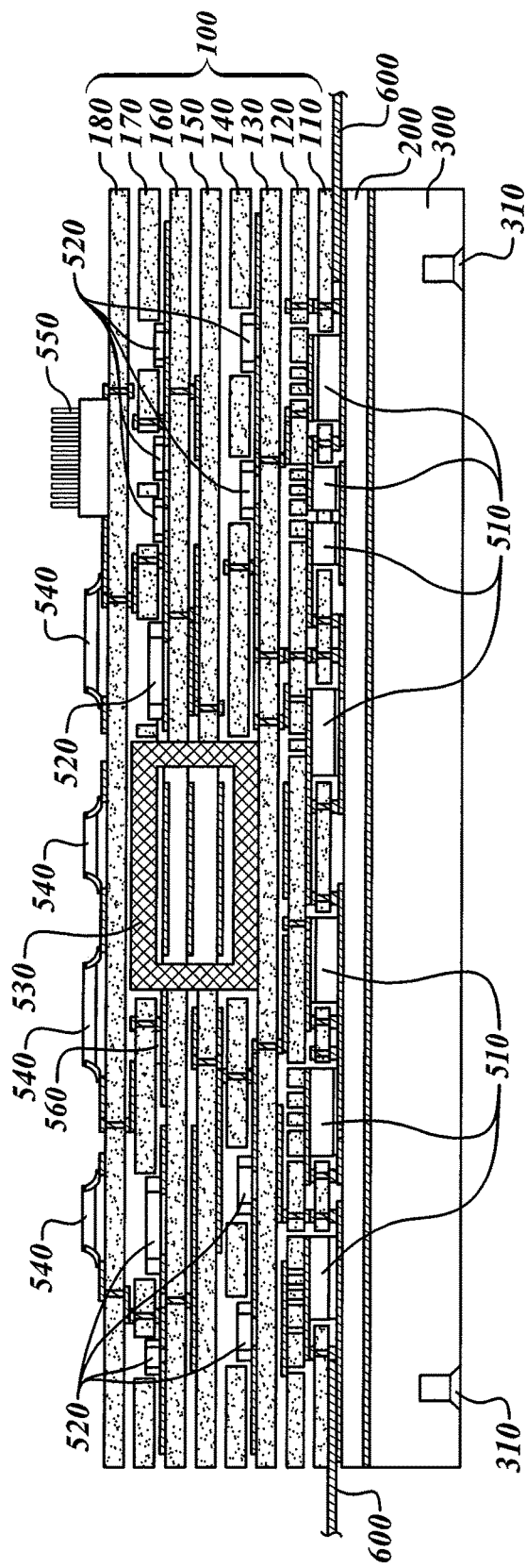
FIG. 2 is a side view of a multilayer electronics assembly prior to fusion bonding.

As noted above, the discrete electrical circuit components of the multilayer electronics assembly 10 are bonded to the internal layers of the assembly prior to fusion bonding. FIG. 2 shows a more detailed side view of an example multilayer electronics assembly prior to fusion bonding.

Starting from the bottom of the assembly, a first layer 300 is a heat-sink. In this example, the heat-sink 300 can be cast to support a variety of thermal interface options, e.g., solid with mounting holes 310 for conduction, channels for liquid (not shown), or pin fin/slotted fins (not shown) for cooling air.

A second layer is a base layer 200 shown in this example with copper on each side. As with the base substrate 20, the base layer 200 can be an aluminum nitride (AlN) direct bonded copper (DBC) substrate. The base layer 200 can be attached to the heat-sink 300 by epoxy, solder (nanosilver sintered solder, or, if the heat-sink is attached after the fusion bonding process, standard solder), or, if the base layer 200 is not clad with copper on the side facing the heat sink, fusion bonding (either separately or as a single act for the whole assembly). A plurality of power semiconductor dies 510, such as MOSFETs, are placed with either side down to the base layer 200 in order to facilitate an optimal circuit layout. As discussed in greater detail below, these semiconductor dies 510 can be attached to the base layer 200 and a multilayer electronics assembly 100 using a device attachment technique such as nanosilver sintering or transient liquid phase bonding.

The multilayer electronics assembly 100 is arranged above the base layer 200. A first (lowest) layer 110 of the multilayer electronics assembly 100 can act as a spacer and interconnect layer between top and bottom sides of the semiconductor dies 510. A plurality of layers 120, 130, 140, 150, 160, 170, and 180 are stacked above the first layer 110. These layers can include discrete electronic components 520, 530, and 560 bonded thereto by a device attachment technique such as nanosilver sintering or transient liquid phase bonding. The discrete electronic components 520 can be, for example, passive discrete resistors, capacitors, a magnetic device, or an active semiconductor device. Surface mount techniques can be used to add further components 540 and 550 topside. The device can include a power interconnect 600, which can be, for example, a flat copper ribbon interconnect for supplying power to the device.

The dielectric properties of a fluoropolymer composite such as polytetrafluoroethylene (PTFE) filled with glass and ceramic can contribute to a multilayer structure including power electronics that is well suited for radiofrequency applications. However, as noted above, the scope of the present disclosure is not limited to the use of PTFE as a substrate material.

Likewise, the present disclosure is not solely limited to fusion bonded assemblies. For example, it is also possible to create a multilayer module with three dimensionally embedded discrete electrical circuit components by utilizing layers made of printed wire board (PWB) materials such as using epoxy fiberglass (FR4) or polyamide. The layers can be assembled using, for example a controlled adhesive, such as a reinforcement material pre-impregnated with a resin matrix (a "prepreg"), can be directly assembled with nanosilver sintering, can be directly assembled via transient liquid phase bonding, or can be assembled using a combination of these techniques. In the case of direct assembly with nanosilver sintering or transient liquid phase bonding, the layers could be spaced a sufficient amount to allow outgassing during processing. An encapsulant could then be used to seal gaps between layers, if environmental exposure is a concern.

Nanosilver sintering or transient liquid phase bonding makes it possible to attach devices to an individual layer and then subsequently sinter one layer to another without worrying about the previously attached devices becoming detached due to the heat required to attach subsequent devices. For example, the bonding material (in the case of nanosilver sintering or transient liquid phase bonding) for the devices goes through a state transition following processing to attach the devices that results in requiring a significantly higher temperature post-processing in order to change back to a liquid, flowable, or pliable state. This post-processing state transition temperature is also substantially higher than the temperature required to initially attach the devices. The resulting structure would include discrete electrical circuit components that are three dimensionally embedded within a multilayer module without requiring the creation of cavities in the layers post assembly.

III. Method of Manufacture

Several acts for embedding discrete electrical circuit components three dimensionally within a multilayer module are hereinafter described with references to FIGS. 3A-3F, 4, and 5.

Figure 5:
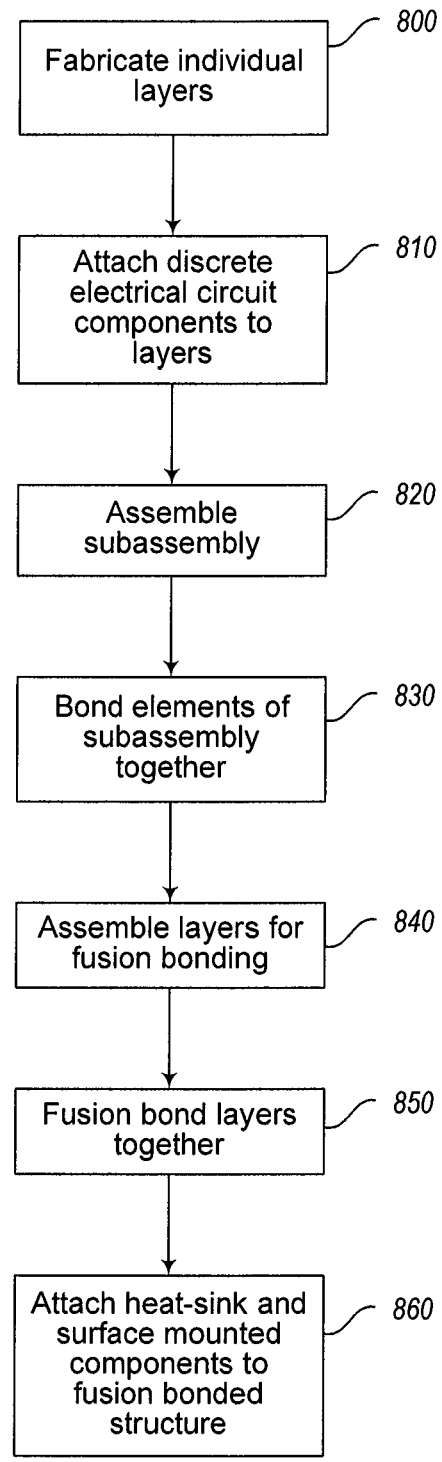
FIG. 5 illustrates a flow chart of several sequential acts for embedding discrete electrical circuit components within a multilayer module.

In a first act, 800 in FIG. 5, the individual layers of the multilayer electronics assembly are fabricated. For example, FIG. 3A illustrates the layers 110 and 200. A layer 110 can be a fluoropolymer composite (such as polytetrafluoroethylene, PTFE) filled with glass and ceramic. The base layer 200 includes a conductor 410, such as copper on either side. As noted above, the base layer 200 can be a direct bond copper substrate formed of an AlN board. For layers where nanosilver sintering is to be used for device attachment, the surface final finish can be gold or silver. As shown in FIG. 3A, the individual layers can include vias 420, that allow for connectivity between layers.

In a second act, 810 in FIG. 5, discrete electrical circuit components are attached to the individual layers. For example, FIG. 3B illustrates discrete electrical circuit components 520, which can be passive elements such as resistors and capacitors, or small signal active devices, attached to an individual layer 130. The discrete electrical circuit components 520 can be bonded to the layer 130 using nanosilver sintering or transient liquid phase bonding. One example of transient liquid phase bonding is described in "Highly Reliable Nickel-Tin Transient Liquid Phase Bonding Technology for High Temperature Operational Power Electronics in Electrified Vehicles", by Sang Won Yoon, Satoshi Yasuda, Michael D. Glover, Koji Shiozaki. An example of nanosilver sintering is described in International Publication No. WO 2005/079353.

Figure 4:
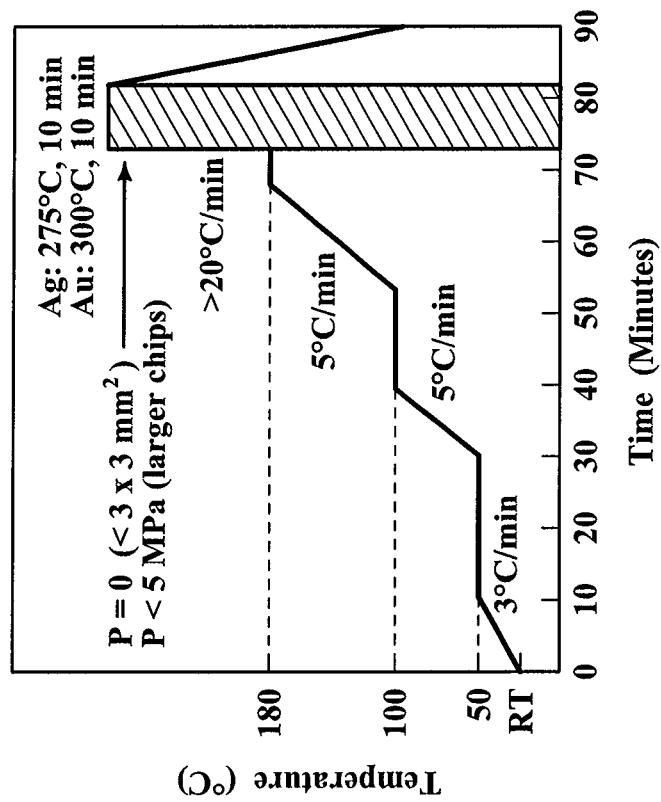
FIG. 4 illustrates one example temperature profile for nanosilver sintering.

In the present example, the discrete electrical circuit components 520 are attached to the individual layer 130 by nanosilver sintering, using the temperature profile shown in FIG. 4. In this example, no pressure is used for die attachment of components that are smaller than 10 mm×10 mm.

In a third act, 820 in FIG. 5, a subassembly is assembled for bonding. For example, FIG. 3C illustrates the assembly of layers 110 and 120 with the base layer 200 and the power semiconductor die 510. The interconnecting posts 430 assist with the alignment of the layers. In this example, nanosilver solder paste is silkscreened onto each of layers 110, 120, and 200. For example, a 50 μm thick layer of nanosilver is silkscreened on and allowed to air dry. Then a 10 μm layer of nanosilver is applied, the power semiconductor die 510 are put in place, and the layers 200, 110, and 120 are arranged in preparation for the sintering process. Layer 120 is shown with vent holes 122 drilled above and or around the periphery of the power semiconductor die 510. These vent holes 122 allow the solvents and binder in the nanosilver solder paste to escape during the sintering process.

Figure 3D:
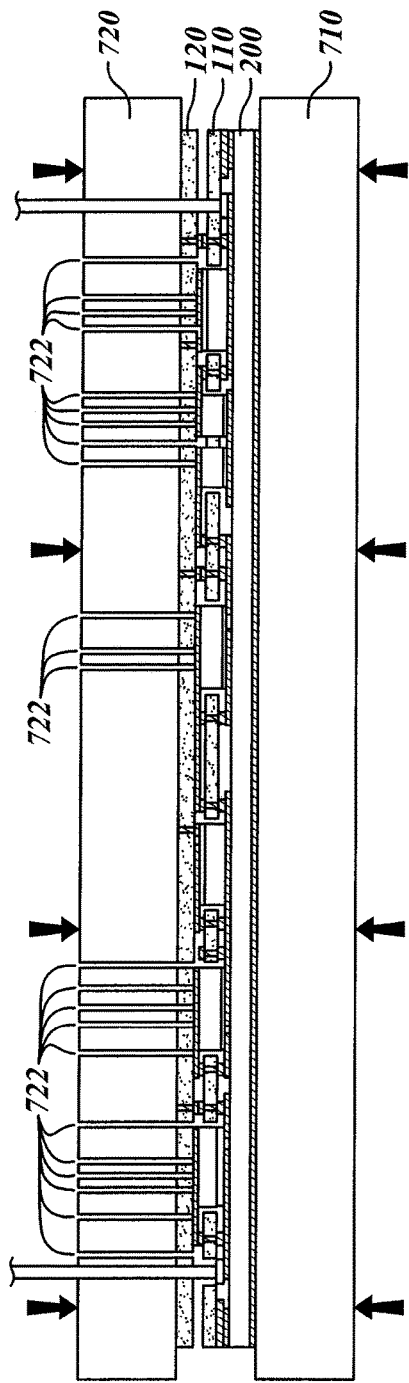

Next, as shown at 830 in FIG. 5, the elements of the subassembly are bonded together. For example, as shown in FIG. 3D, pressure is applied with plates 710 and 720. Plate 720 includes vent holes 722 aligned with the vent holes 122 in the layer 120. The pressure is applied to ensure that solvents are baked out from underneath the die and the vent holes 722 allow the gas to escape. In this example, approximately 3-5 MPa is used for the nanosilver sintering process when die of greater than 10 mm×10 mm are used. The profile in this example is essentially the same as shown in FIG. 4, except that pressure is applied at the 180° C., 10 minute portion of the profile (and as/if needed during ramp up to 180° C.). Pressure can then be removed before taking up to 275/300° C.

Figure 3E:
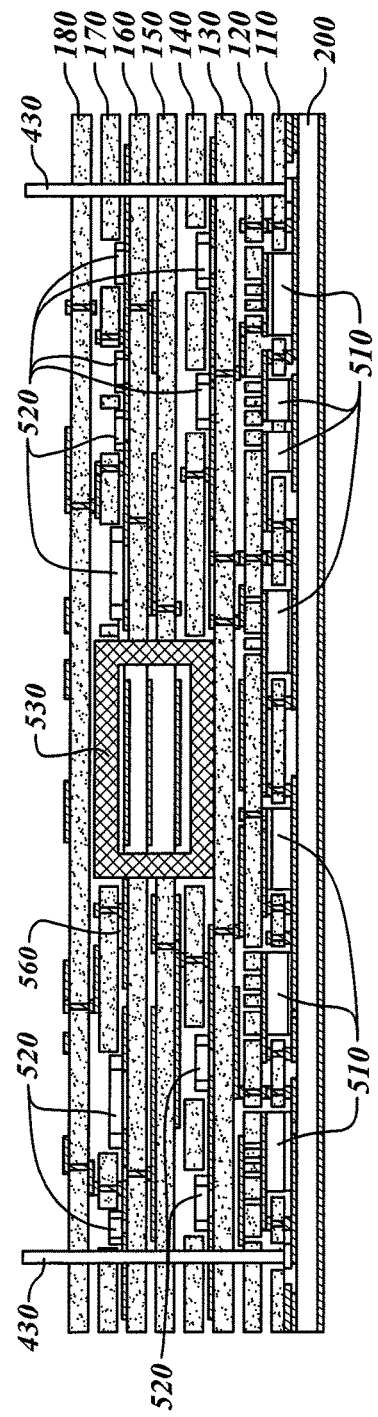

Next, as shown at 840 in FIG. 5, the layers are assembled for fusion bonding. For example, as shown in FIG. 3E, the remaining layers 130, 140, 150, 160, 170, and 180 are stacked along with the sub-assembly of layers 110, 120, and 200 that are now sintered together. These layers are then fusion bonded (850, FIG. 5). Fusion bonding is typically accomplished in an autoclave or hydraulic press by heating substrate layers past the PTFE composite melting point while simultaneously applying a determined amount of pressure, preferably mechanically, isostatically, or a combination of both. The alignment of layers is typically secured by a precision fixture with a plurality of pins (such as the interconnecting posts 430 in the present example), preferably three to eight but possibly more, to stabilize flow as the PTFE resin changes state to a viscous liquid and adjacent layers fuse under pressure. Depending on the size of the stack being bonded, the pin arrangement for alignment of the stack is preferably triangular or rectangular. The pins themselves are preferably round, square, rectangular, oval, or diamond-shaped, but may have other shapes.

Figure 3F:
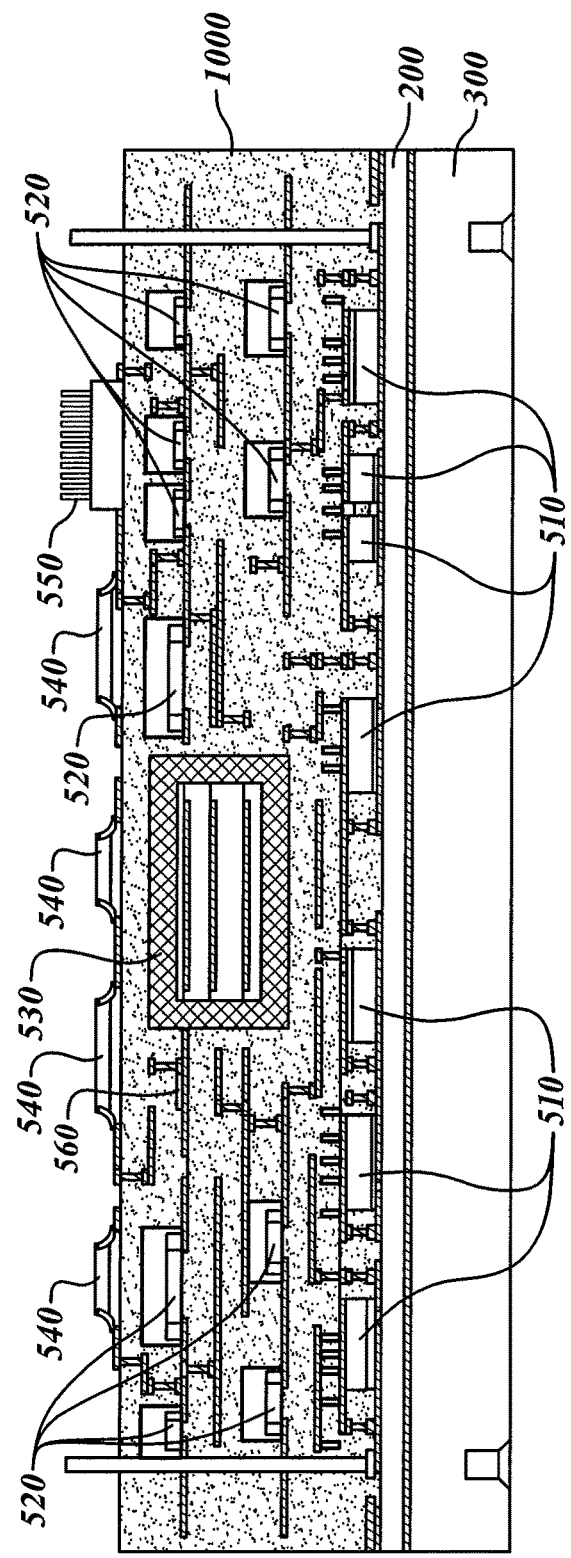

Because the discrete electrical circuit components 510, 520, and 560 were attached to the respective layers by nanosilver sintering or transient liquid phase bonding, the discrete electrical circuit components 510, 520, and 560 are able to remain bonded to the conductive paths in the module during the fusion bonding process. For example, the melting temperature of an alloy formed by transient liquid phase bonding and the melting point of the bond formed nanosilver sintering far exceed the temperature required to achieve a PTFE composite melting point for fusion bonding. The resulting three dimensional, unitary, multilayer electronics module 1000 is depicted in FIG. 3F. The multilayer electronics module 1000 includes a plurality of discrete electrical circuit components 510, 520, and 560 embedded three dimensionally within the fusion bonded block. Unlike conventional multilayer, fusion bonded modules, the module 1000 in FIG. 3F, includes discrete electrical circuit components stacked in layers such that the discrete electrical circuit components overlap within the vertical dimension. In addition, the discrete electrical circuit components are electrically connected to surrounding layers without the need for additional post-fusion drilling and plating. Further, immunity to moisture ingress is supported by the integrity of the unitary structure formed through fusion bonding.

After fusion bonding is performed, the heat-sink and the top-side surface mount components are attached (860, FIG. 5). For example, as shown in FIG. 3F, the heat-sink 300 is attached below the multilayer electronics module 1000, and top-side surface mount technology parts 540 and 550 are attached to a top surface of the multilayer electronics module 1000. A low thermal resistance can be achieved by fusion bonding the heat-sink 300 to the base layer 200, if the base layer 200 is not clad with copper on the side facing the heat sink. In one example, this can be achieved as part of the fusion bonding act discussed with reference to FIG. 3E. In this case, the heat-sink 300 can be designed with a 'web' matrix between modules to facilitate cutting the modules apart. This cutting may be achieved with water jet cutting. In another example, the heat-sink 300 can be AlSiC cast in sectional modules held together by the Al skin so that only the Al skin needs to be cut. In another example, the heat-sink 300 could be soldered to the assembly illustrated in FIG. 3E, or bonded thereto.

The various embodiments described above can be combined to provide further embodiments. All of the U.S. patents, U.S. patent application publications, U.S. patent applications, foreign patent applications and non-patent publications referred to in this specification are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multilayer electronics assembly, comprising:
   a plurality of stacked substrate layers, each of the plurality of substrate layers fusion bonded to at least an adjacent one of the plurality of substrate layers to form a unitary block;
   a first discrete electrical circuit component bonded to a first layer of the plurality of substrate layers;
   a bonding material interposed between the first discrete electrical circuit component and the first layer which provides the bond between the first discrete electrical circuit component and the first layer, the bonding material having a reflow temperature at which the bonding material becomes flowable that is higher than a fusion bonding temperature of the substrate layers such that the bonding material maintains the first discrete electrical circuit component solidly bonded to the first layer despite exposure of the bonding material to the fusion bonding temperature; and
   a plurality of vent holes provided in a second layer of the plurality of substrate layers, the plurality of vent holes configured to operably allow gases to escape during bonding of the first discrete electrical circuit component to the first layer, and the plurality of vent holes being sealed within an interior of the unitary block formed by the plurality of substrate layers fusion bonded together.

2. The multilayer electronics assembly according to claim 1, further comprising:
   a second discrete electrical circuit component bonded to a second layer of the plurality of substrate layers.

3. The multilayer electronics assembly according to claim 2, wherein the plurality of substrate layers are stacked in a first direction, the first discrete electrical circuit component is bonded at a lower attachment side of the first discrete electrical circuit component to the first layer of the plurality of substrate layers, the second discrete electrical circuit component is bonded at a lower attachment side of the second discrete electrical circuit component to the second layer of the plurality of substrate layers, and the first discrete electrical circuit component overlaps the second discrete electrical circuit component in the first direction with the lower attachment sides of the first and second discrete electrical circuit components facing in a same direction aligned with the first direction in which the plurality of substrate layers are stacked.

4. The multilayer electronics assembly according to claim 1, wherein the plurality of substrate layers are stacked in a first direction, and the first discrete electrical circuit component is positioned between adjacent layers of the plurality of stacked substrate layers.

5. The multilayer electronics assembly according to claim 1, wherein the substrate layers include a fluoropolymer composite.

6. The multilayer electronics assembly according to claim 1, wherein the bonding material is formed from at least one material having an initial flow temperature at which the bonding material becomes flowable to bond the first discrete electrical circuit component and the first layer, and the initial flow temperature is lower than the reflow temperature.

7. The multilayer electronics assembly according to claim 1, wherein the bonding material is a solid immediately prior to the reflow temperature being reached.

8. The multilayer electronics assembly according to claim 1, wherein the bonding material is nanosilver sintered solder.

9. The multilayer electronics assembly according to claim 1, wherein the bonding material is a transient liquid phase bonded alloy.

10. The multilayer electronics assembly according to claim 1, wherein the first discrete electrical circuit component is one of a passive discrete resistor, a capacitor, a magnetic device, and an active semiconductor device.

11. A multilayer electronics module, comprising:
a three dimensional, unitary block of a first material having a melting point at a first temperature; and
a plurality of discrete electrical circuit components embedded within the unitary block, each of the plurality of discrete electrical circuit components bonded to the block by a bonding material having a reflow point, at which the bonding material becomes flowable, at a second temperature that is higher than the first temperature such that the bonding material maintains the plurality of discrete electrical circuit components solidly bonded to the block despite exposure of the bonding material to the first temperature, and
wherein a plurality of vent holes are provided and sealed within an interior of the unitary block, the plurality of vent holes configured to operably allow gases to escape during bonding of the plurality of discrete electrical circuit components to the block by the bonding material.

12. The multilayer electronics module according to claim 11, wherein the unitary block includes an exterior surface defined by a top surface, a bottom surface, and a plurality of side surfaces, and the first material completely surrounds at least a first one of the plurality of discrete electrical circuit components such that the first material is positioned between all sides of the first one of the plurality of discrete electrical circuit components and any point on the exterior surface of the unitary block.

13. The multilayer electronics module according to claim 12, wherein the first material does not directly contact the first one of the plurality of discrete electrical circuit components.

14. The multilayer electronics module according to claim 11, wherein the plurality of discrete electrical circuit components includes a first discrete electrical circuit component bonded at a lower attachment side of the first discrete electrical circuit component to the block, a second discrete electrical circuit component bonded at a lower attachment side of the second discrete electrical circuit component to the block, and a third discrete electrical circuit component bonded at a lower attachment side of the third discrete electrical circuit component to the block, the first discrete electrical circuit component overlaps the second discrete electrical circuit component in a first direction with the lower attachment sides of the first and second discrete electrical circuit components facing in a same direction aligned with the first direction, and the first discrete electrical circuit component overlaps the third discrete electrical circuit component in a second direction that is perpendicular to the first direction, and wherein the first direction is in a thickness direction of the multilayer electronics module.

15. The multilayer electronics module according to claim 11, wherein the first material is a fluoropolymer composite.

16. The multilayer electronics assembly according to claim 11, wherein the bonding material is formed from at least one material having an initial flow temperature at which the bonding material becomes flowable to bond the discrete electrical circuit component and the first layer, and the initial flow temperature is lower than the second temperature.

17. The multilayer electronics assembly according to claim 11, wherein the bonding material is a solid immediately prior to the second temperature being reached.

18. The multilayer electronics module according to claim 11, wherein the bonding material is nanosilver sintered solder.

19. The multilayer electronics module according to claim 11, wherein the bonding material is a transient liquid phase bonded alloy.

20. The multilayer electronics module according to claim 11, wherein the plurality of discrete electrical circuit components are selected from a group consisting of a passive discrete resistor, a capacitor, a magnetic device, and an active semiconductor device.

21. A multifunction module, comprising:
a primary substrate, a power semiconductor die bonded to the primary substrate;
a plurality of secondary substrates stacked on the primary substrate and fusion bonded to each other to form a unitary block, a first discrete electrical circuit component bonded to a first substrate of the plurality of secondary substrates with a first material that has a first melting point that is higher than a fusion bonding temperature of the substrate layers such that the first material maintains the first discrete electrical circuit component solidly bonded to the first substrate despite exposure of the first material to the fusion bonding temperature, a second discrete electrical circuit component bonded to a second substrate of the plurality of secondary substrates with a second material that has a second melting point that is higher than the fusion bonding temperature of the substrate layers such that the second material maintains the second discrete electrical circuit component solidly bonded to the second substrate despite exposure of the first material to the fusion bonding temperature, and wherein a plurality of vent holes are provided in at least one of the plurality of secondary substrates, the plurality of vent holes configured to operably allow gases to escape during bonding of the power semiconductor die to the primary substrate, and the plurality of vent holes being sealed within an interior of the unitary block; and an active electronic component attached to an external surface of one of the plurality of secondary substrates that is positioned furthest from the primary substrate.

22. The multifunction module according to claim 21, wherein the first material is the same as the second material.

23. The multifunction module of claim 21, wherein the first discrete electrical circuit component is bonded at a lower attachment side of the first discrete electrical circuit component to the first layer, the second discrete electrical circuit component is bonded at a lower attachment side of the second discrete electrical circuit component to the second layer, and the second discrete electrical circuit component overlaps the first discrete electrical circuit component in a first direction in which the plurality of secondary substrates are stacked with the lower attachment sides of the first and second discrete electrical circuit components facing in a same direction aligned with the first direction.

24. A multilayer electronics assembly, comprising:
a plurality of substrate layers stacked in a first direction, each of the plurality of substrate layers bonded to at least an adjacent one of the plurality of substrate layers to form a unitary block;
a bonding material having an initial transition temperature at which the bonding material becomes initially flowable, and a subsequent transition temperature at which the bonding material subsequently becomes flowable after hardening following the initially becoming flowable, the initial transition temperature lower than the subsequent transition temperature;
a first discrete electrical circuit component bonded to a first layer of the plurality of substrate layers with the bonding material;
a second discrete electrical circuit component bonded to a second layer of the plurality of substrate layers with the bonding material, the second discrete electrical circuit component overlaps the first discrete electrical circuit component in the first direction; and
a plurality of vent holes provided in at least one of the plurality of substrate layers, the plurality of vent holes configured to operably allow gases to escape during bonding of the first discrete electrical circuit component to the first layer with the bonding material, and the plurality of vent holes being sealed within an interior of the unitary block.

25. The multilayer electronics assembly according to claim 24, wherein the bonding material is a solid immediately prior to the subsequent transition temperature being reached.

26. The multilayer electronics assembly according to claim 24, wherein the substrate layers include at least one of epoxy fiberglass and polyamide.

27. The multilayer electronics assembly according to claim 24, wherein the bonding material is nanosilver sintered solder.

28. The multilayer electronics assembly according to claim 24, wherein the bonding material is a transient liquid phase bonded alloy.

29. The multilayer electronics assembly according to claim 24, wherein the first discrete electrical circuit component is one of a passive discrete resistor, a capacitor, a magnetic device, and an active semiconductor device.

30. The multilayer electronics assembly of claim 24, wherein the first discrete electrical circuit component is bonded at a lower attachment side of the first discrete electrical circuit component to the first layer, the second discrete electrical circuit component is bonded at a lower attachment side of the second discrete electrical circuit component to the second layer, and the second discrete electrical circuit component overlaps the first discrete electrical circuit component in the first direction with the lower attachment sides of the first and second discrete electrical circuit components facing in a same direction aligned with the first direction.

* * * * *